United States Patent
Ai

(10) Patent No.: US 7,442,903 B2
(45) Date of Patent: Oct. 28, 2008

(54) HEAT SINK FOR ELECTRONIC DEVICE

(75) Inventor: Chi Ai, Hsin-Chuang (TW)

(73) Assignee: Asia Vital Components Co., Ltd., Kaohsiung (TW)

( * ) Notice: Subject to any disclaimer, the term of this patent is extended or adjusted under 35 U.S.C. 154(b) by 74 days.

(21) Appl. No.: 11/495,938

(22) Filed: Jul. 31, 2006

(65) Prior Publication Data

US 2008/0023465 A1    Jan. 31, 2008

(51) Int. Cl.
*H05B 3/06* (2006.01)
*F28F 7/00* (2006.01)

(52) U.S. Cl. .................. 219/540; 165/185; 165/121; 165/80.3; 361/697; 361/704; 361/710

(58) Field of Classification Search ................ 219/540; 165/185, 121, 80.3; 361/697, 704, 710
See application file for complete search history.

(56) References Cited

U.S. PATENT DOCUMENTS 6,775,139 B2 *   8/2004   Hsueh ..................... 361/697

* cited by examiner

*Primary Examiner*—Shawntina Fuqua

(57) ABSTRACT

A heat sink for the electronic device is disclosed. The heat sink comprises a hub, a plurality of first supporting elements and a frame. A fan is axially connected to the hub. The first supporting elements are positioned along the periphery of the hub and protrude outwards extending from the protruding ends to connect to the frame. The frame forms an outlet and connects to a heating element. Thus, the outlet and the fan have the side opposite to the fan set facing the heating element so that the distance between the fan and the heating element may be reduced. Thus, the loss of the air flow pressure may be minimized and the heat dissipation effect may be effectively promoted.

7 Claims, 6 Drawing Sheets

HEAT SINK FOR ELECTRONIC DEVICE

FIELD OF THE INVENTION

The present invention relates to a heat sink for an electronic device, and more particularly to a heat sink comprising a fan positioned upside down in a frame so that the distance between the fan the heating element can be shortened.

BACKGROUND OF INVENTION

The conventional fan, shown in FIGS. 1, 2 and 3, comprises a frame 11 and a fan 12. The frame 11 has a circular wall, a hub 111 connected to the fan and a plurality of ribs 112 extending outwards from the hub 111 with the hub 111 positioned at the central region of the frame 11. The fan 12 is axially positioned on the hub 111.

An outlet 113 is formed between two adjacent ribs 112 of the frame 11 for guiding the air flow. An outlet 114 is formed at a side opposite to the outlet 113 to lead the air into the frame 11.

To assemble the fan 12 to the heating element 13, for instance, the heat dissipater, a side of the hub 111 of the frame 11 is faced to the heating element 13, and a plurality of securing elements 14 is penetrated through the frame 11 to secure to heating element 13. Thus, the outlet 113 faces the heating element 13.

However, the conventional design has defects, for example, because the outlet 113 facing the heating element 13 has the multiple ribs 112, when the fan 12 is operated, air flows passes through the outlet 113, the ribs 112 block some of the air from flowing out from the outlet 113. Thus, the heat dissipation effect is adversely affected, and also the noise is increased.

Furthermore, the hub 111 and the ribs 112 are positioned between the fan 12 and the heating element 13 with a distance between the fan 12 and the heating element 13. When the air flows due to the operation of the fan 12, the air pressure decreases due to the distance between the fan 12 and the heating element 13, and the air pressure reaching the heating element 13 is correspondingly decreased to adversely affect the heat dissipation efficiency.

SUMMARY OF THE INVENTION

Accordingly, the present invention provides a fan having an air outlet corresponding to a heating element such that air may smoothly flow through the outlet without being blocked and thereby promote the heat dissipation efficiency.

According to another aspect of the present invention, the fan has the other side opposite to the fan set corresponding to the heating element to shorten the distance between the fan and the heating element, in order to minimize the lost of the air pressure.

According to another aspect of the present invention, the fan is positioned in the supporting elements such that the air flows through the gaps of the supporting elements to increase the air flow and also protect the fan.

In accordance of the above objectives of the present invention, a heat sink for the electronic device is provided, which comprises a hub, a fan rotatably connected to the hub, a plurality of supporting elements, each having a first portion and a second portion, and a frame forming an outlet and is connected to a distal end of the second portion. The first portion protrudes outward and is positioned along the fan, and the second portion is connected to the protruding end of the first portion and extends towards a vertical direction from the first portion. The frame is positioned corresponding to a heating element. Thus, the outlet and a side of the fan opposite to the hub face the heating element.

BRIEF DESCRIPTION OF THE DRAWING

For a more complete understanding of the present invention, reference will now be made to the following detailed description of preferred embodiments taken in conjunction with the following accompanying drawings.

DETAIL DESCRIPTION OF THE INVENTION

Figure 1:
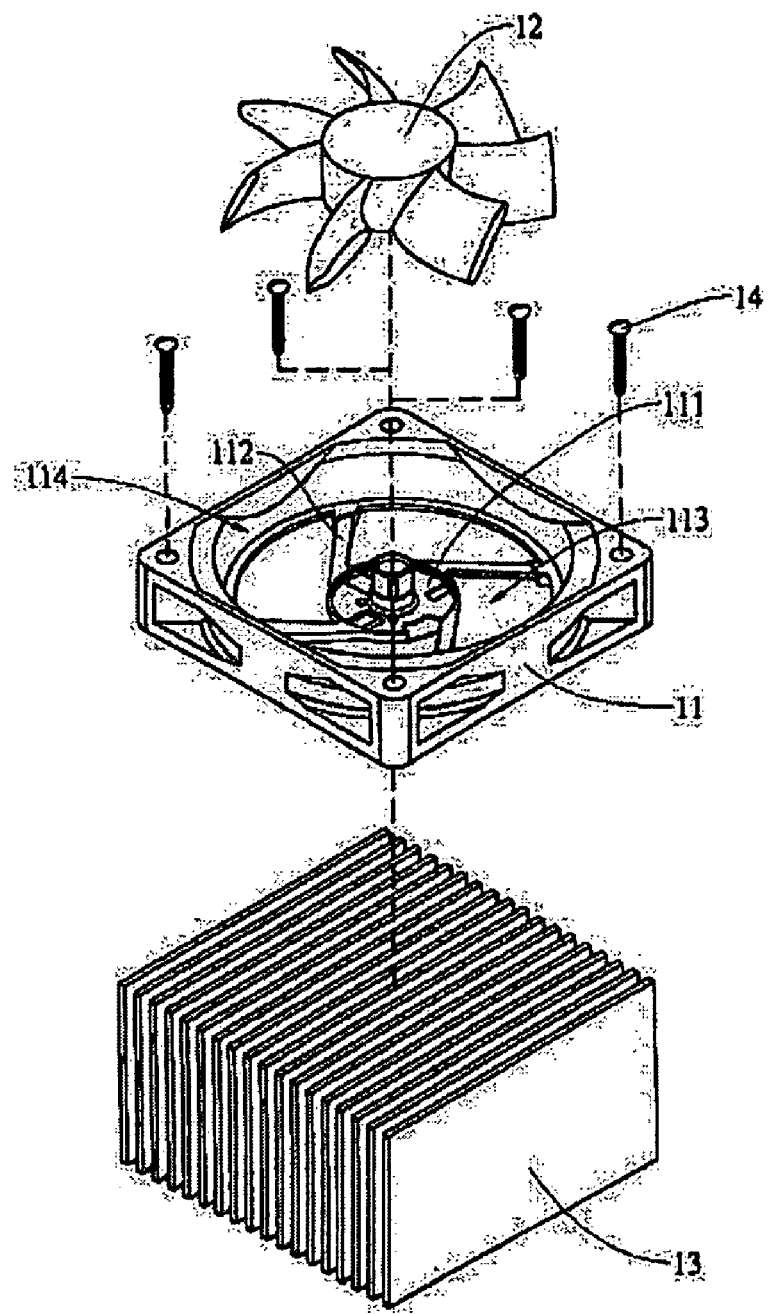
FIG. 1 is an exploded view of a conventional heat sink.
Figure 2:
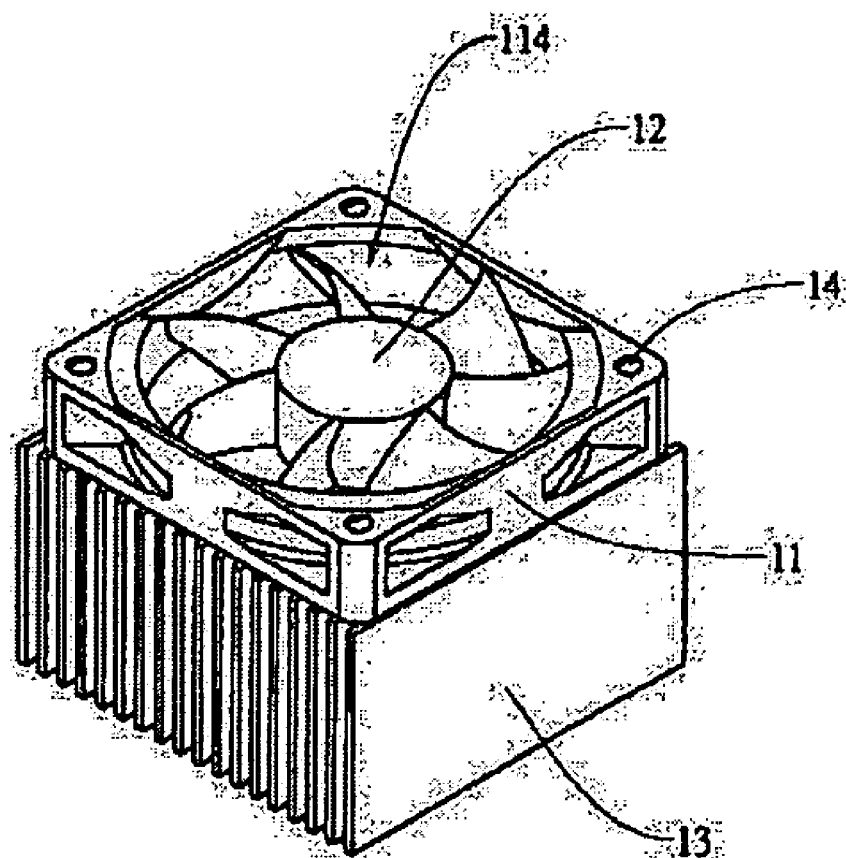
FIG. 2 is perspective view of a conventional heat sink.
Figure 3:
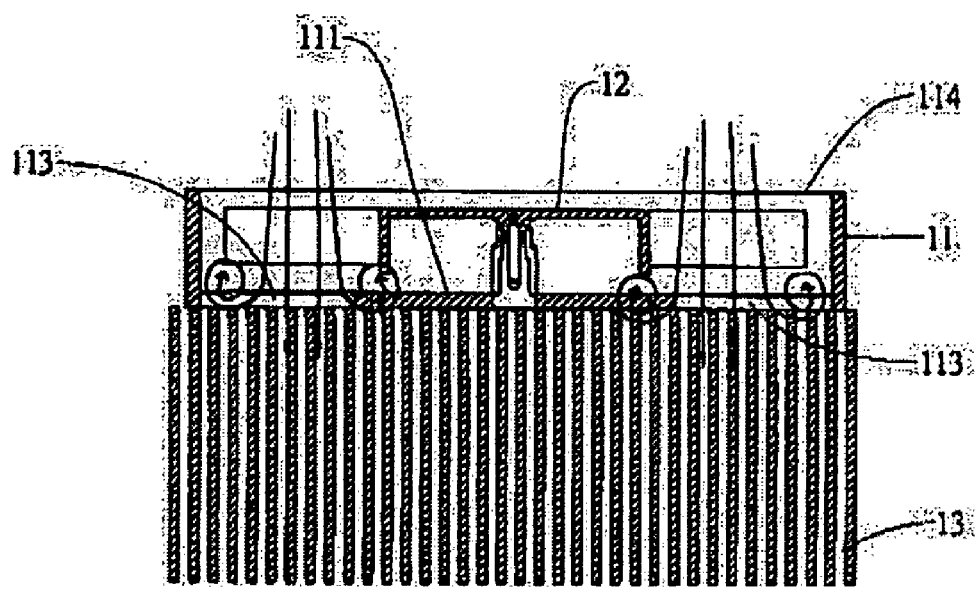
FIG. 3 is a sectional view of a conventional heat sink.
Figure 4:
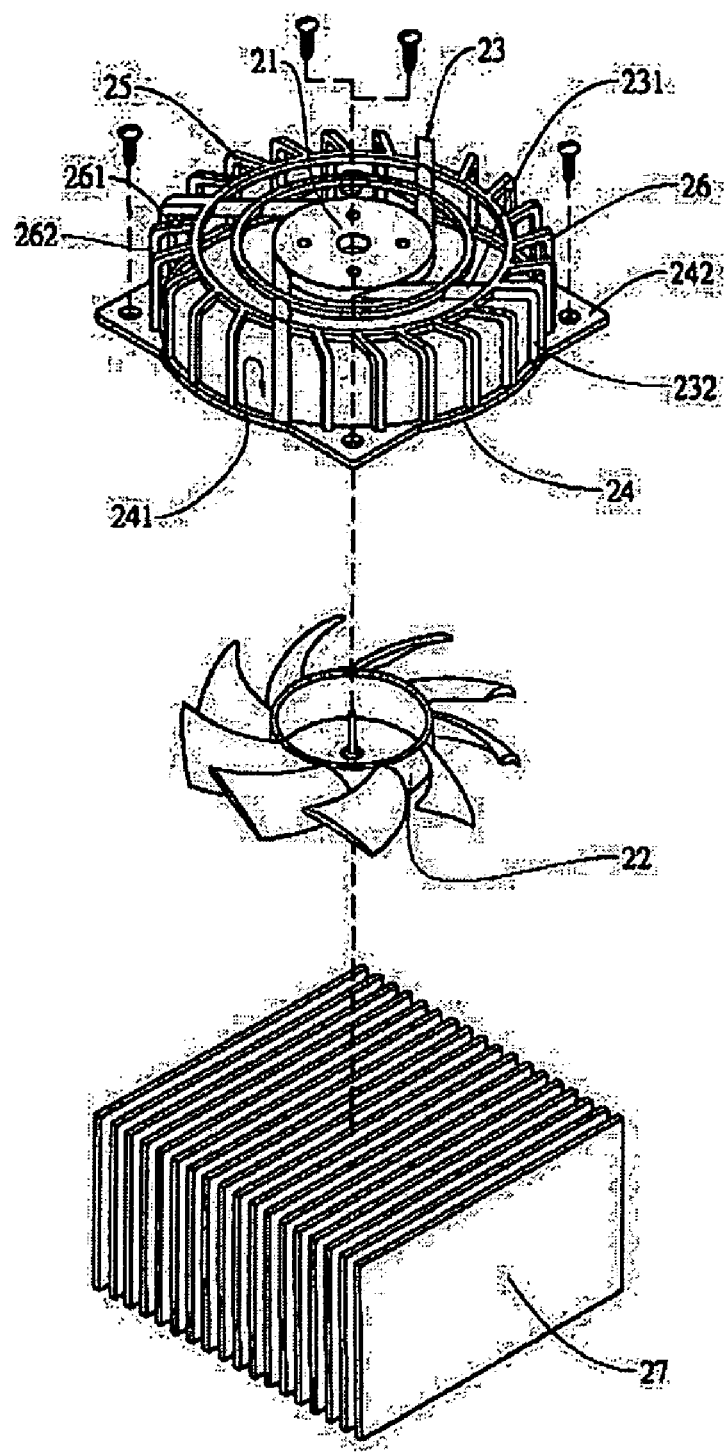
FIG. 4 is an exploded view of a heat sink according to a preferred embodiment of the present invention.
Figure 5:
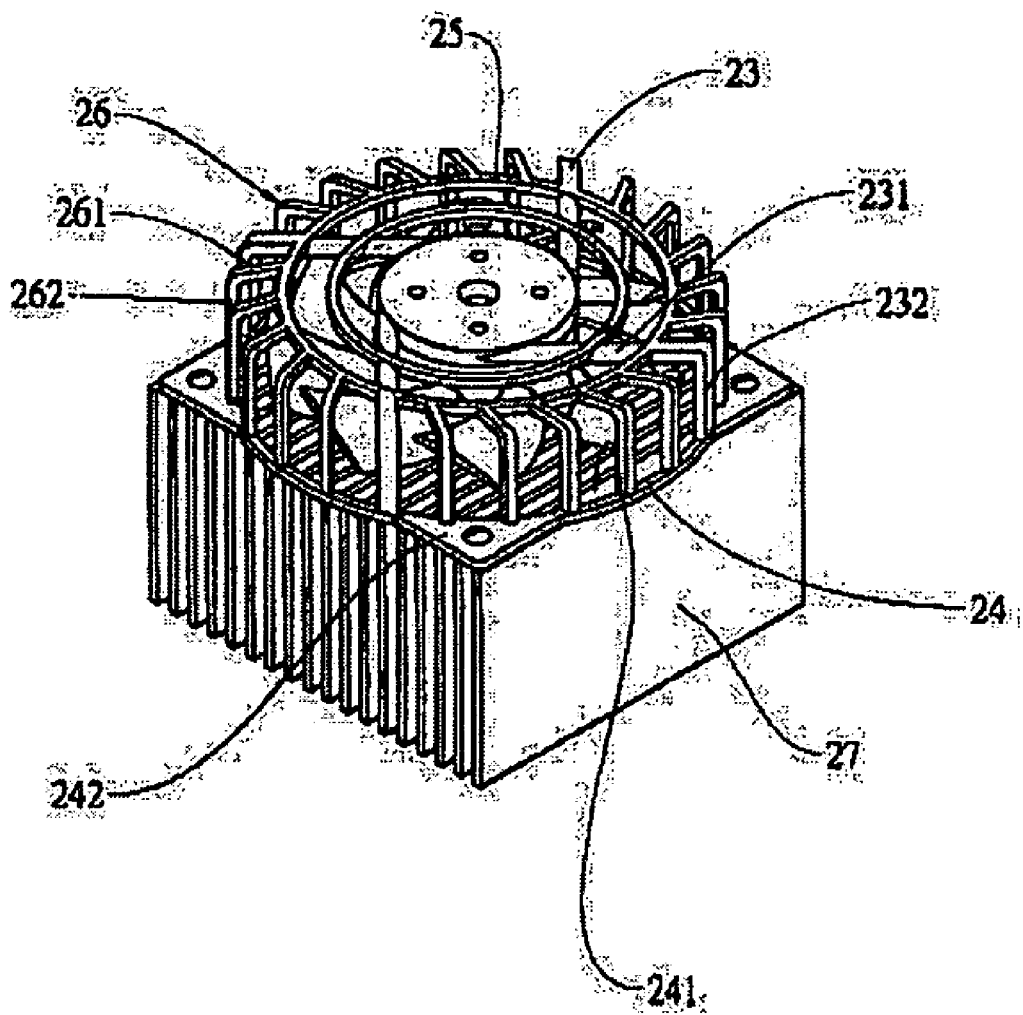
FIG. 5 is a perspective view of a heat sink according to a preferred embodiment of the present invention.

FIG. 4 is an exploded view of a heat sink according to a preferred embodiment of the present invention. FIG. 5 is a perspective view of a heat sink according to a preferred embodiment of the present invention. Referring to FIGS. 4 and 5, the heat sink comprises a hub 21 and a cage-shaped frame, which provides a plurality of first supporting elements 23, at least a second supporting element 25, a plurality of third supporting elements 26 and a hollow-plate-shaped frame base 24. An end of the hub 21 is roratably connected to a fan 22. Each of the first supporting elements 23 has a first portion 231 and a second portion 232. The first portion 231 is positioned along the hub 21 and extends outwards from the circular periphery of another end of the hub 21, and the second portion 232 extends from a distal end of the first portion 231 towards a vertical direction. The extending angle of the first portion 231 and the second portion 232 may be 90°, greater than 90°, or smaller than 90°.

The frame base 24 has an outlet 241 and is connected to a distal end of the second portion 232. The frame base 24 has at least a securing portion 242.

The second supporting element 25 (two supporting elements 25 are shown in FIGS. 4 and 5 the figure) is joined to the first portion 231 of the respective first supporting element 23.

The third supporting elements 26 are disposed between the first supporting elements in a way of equidistantly spacing apart from each other with an end of the respective third supporting element 26 being joined to the second supporting element 25 the outer second supporting element 25 shown in FIGS. 4 and 5 and the frame base 24. Each of the third supporting elements 26 has a third portion 261 extending outwards from the second supporting element 25 and a fourth portion 262 extending downward from the third portion 261 vertically to connect to the frame base 24.

The frame base 24 is placed to face a heating element 27 (a heat dissipater is shown in FIGS. 4 and 5, and a securing element is penetrated into the respective securing portion 242 to secure the frame base 24, the hub 21, the first, the second and the third supporting elements 23, 25, 26 to the heating element 27. Thus, the outlet 241 and a side of the fan 22 are positioned opposite to the hub 21 facing the heating element 27.

Figure 6:
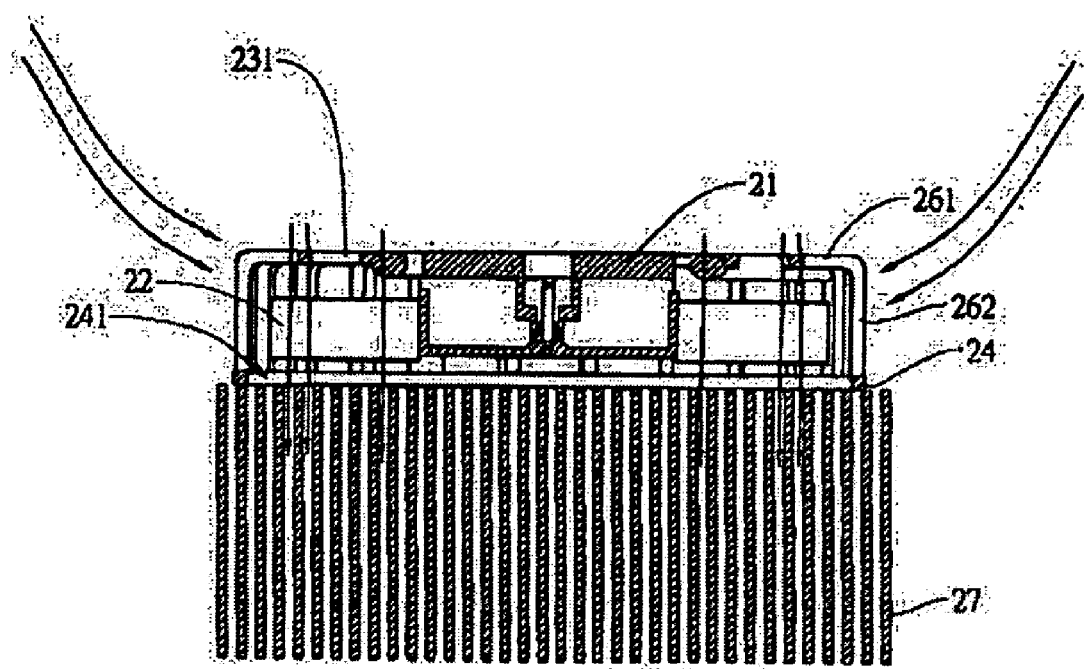
FIG. 6 is a sectional view of a heat sink according to a preferred embodiment of the present invention.

FIG. 6 is a sectional view of a heat sink according to a preferred embodiment of the present invention. Referring to FIG. 6, when the fan 22 rotates, the air flows from the periphery of the hub 21 and enters into the frame. In other words, the air is guided from the first, the second and the third supporting element 23, 25, 26 to the heating device 27 by the fan 22 via the outlet 241 to effectively promote the heat dissipation effect.

Accordingly, the present invention has at least the following advantages.

The outlet 241 corresponding to the heating element 27 does not block the air so that the air smoothly flows from the outlet 241 to the heating element 27 and thereby to effectively promote the heat dissipation effect with reduction of the noise.

The fan 22 is positioned next to the heating element 27 instead of the hub 21 being next to the heating element to minimize the distance between the fan 22 and the heating element 27 so that the air flow pressure can be effectively increased.

The fan 22 is received in the cage-shaped frame formed with the first, the second and the third supporting elements 23, 25, 26 such that the air induced by the fan 22 is guided through the openings between the supporting elements to increase the amount of the air flows in addition to protection for the fan 22.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations in which fall within the spirit and scope of the included claims. All matters set forth herein or shown in the accompanying drawings are to be interpreted in an illustrative and non-limiting sense

What is claimed is:

1. A heat sink for an electronic device comprising
a hub with a first end and a second end;
a fan being positioned next to said hub and axially connected to said first end;
a cage-shaped frame having a hollow-plate-shaped frame base, which forms an air outlet, and having a space for receiving said fan and said hub in a way of said fan being disposed next to said air outlet; and
a heating element being secured to said frame base
wherein, said frame further comprises:
   a plurality of first supporting elements extending outward radially from a circular edge of said second end in a way of said first supporting elements equidistantly spacing apart from each other with a distal end of the respective first supporting element being attached to said frame base;
   at least a second supporting element surrounding said first end and being joined to said first supporting elements; and
   a plurality of third supporting elements being disposed between said first supporting elements in a way of equidistantly spacing apart from each other and being joined to said second supporting element and said frame base.

2. The heat sink for an electronic device according to claim 1, wherein said frame base has at least a securing portion for being secured to said heating element.

3. The heat sink for an electronic device according to claim 1, wherein each of said first supporting elements has a first portion, which extends outward radially from said circular edge and is joined to said second supporting element, and a second portion, which extends downward from said first portion and is joined to said frame base.

4. The heat sink for an electronic device according to claim 3, wherein each of said third supporting elements has an end being joined to said second supporting element and another end being joined to said frame base.

5. The heat sink for an electronic device according to claim 4, wherein each of said third supporting elements hat a third portion extending outwards from said second supporting element and a fourth portion extending downward to connect to said frame base.

6. The heat sink for an electronic device according to claim 1, wherein said heating element is a heat dissipater.

7. The heat sink for an electronic device according to claim 1, wherein an angle, which is 90°, greater than 90° or smaller than 90°, is formed between said first portion and said second portion.

* * * * *